(12) United States Patent
Wang et al.

(10) Patent No.: US 10,797,151 B2
(45) Date of Patent: Oct. 6, 2020

(54) METAL GATE STRUCTURES FOR FIELD EFFECT TRANSISTORS

(71) Applicant: Taiwan Semiconductor Manufacturing Co., Ltd., Hsinchu (TW)

(72) Inventors: Chih-Wei Wang, Hsinchu (TW); Chia-Ming Tsai, Hsinchu County (TW); Ke-Chih Liu, Hsinchu (TW); Chandrashekhar Prakash Savant, Hsinchu (TW); Tien-Wei Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/438,168

(22) Filed: Jun. 11, 2019

(65) Prior Publication Data

US 2020/0105894 A1    Apr. 2, 2020

Related U.S. Application Data

(60) Provisional application No. 62/737,673, filed on Sep. 27, 2018.

(51) Int. Cl.
| | | |
|---|---|---|
| *H01L 29/76* | (2006.01) | |
| *H01L 29/94* | (2006.01) | |
| *H01L 31/062* | (2012.01) | |
| *H01L 31/113* | (2006.01) | |
| *H01L 31/119* | (2006.01) | |
| *H01L 29/49* | (2006.01) | |
| *H01L 29/78* | (2006.01) | |
| *H01L 29/06* | (2006.01) | |
| *H01L 21/8234* | (2006.01) | |
| *H01L 21/28* | (2006.01) | |
| *H01L 27/088* | (2006.01) | |
| *H01L 29/66* | (2006.01) | |

(52) U.S. Cl.
CPC .... *H01L 29/4966* (2013.01); *H01L 21/28088* (2013.01); *H01L 21/823431* (2013.01); *H01L 21/823437* (2013.01); *H01L 27/0886* (2013.01); *H01L 29/0649* (2013.01); *H01L 29/66795* (2013.01); *H01L 29/785* (2013.01)

(58) Field of Classification Search
CPC ....... H01L 21/28088; H01L 21/823431; H01L 21/823437; H01L 27/0886; H01L 27/0649; H01L 29/4966
USPC .......................................... 257/288
See application file for complete search history.

(56) References Cited

U.S. PATENT DOCUMENTS

2015/0008533 A1*  1/2015  Liaw ............... H01L 21/823821
                                                      257/392
2017/0125298 A1*  5/2017  Jangjian ............. H01L 29/785

* cited by examiner

*Primary Examiner* — David S Blum
(74) *Attorney, Agent, or Firm* — Sterne, Kessler, Goldstein & Fox P.L.L.C.

(57) ABSTRACT

The present disclosure describes a method for the formation of gate stacks having two or more titanium-aluminum (TiAl) layers with different Al concentrations (e.g., different Al/Ti ratios). For example, a gate structure can include a first TiAl layer with a first Al/Ti ratio and a second TiAl layer with a second Al/Ti ratio greater than the first Al/Ti ratio of the first TiAl layer.

20 Claims, 7 Drawing Sheets

FIG. 6

METAL GATE STRUCTURES FOR FIELD EFFECT TRANSISTORS

CROSS-REFERENCE TO RELATED APPLICATION

This application claims the benefit of U.S. Provisional Patent Application No. 62/737,673, titled "Metal Gate Structures of Field Effect Transistors," which was filed on Sep. 27, 2018 and is incorporated herein by reference in its entirety.

BACKGROUND

The threshold voltage of a transistor (e.g., p-type transistor) cart be tuned by adjusting the thickness of work function layers within the transistor's gate structure. However, scaling the transistor gate structure—to manufacture smaller devices—introduces challenges in threshold voltage tuning as adjustments to the work function layer thickness is limited due to a decrease in spacing between transistors.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly, The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The terms "about" and "substantially" can indicate a value that can vary based on a particular technology node associated with the subject semiconductor device. In some embodiments, the terms "about" and "substantially" can indicate a value of a given quantity that varies within 5% of the value (e.g., ±1%, ±2%, ±3%, ±4%, ±5% of the value).

The term "vertical," as used herein, means nominally perpendicular to the surface of a substrate.

The layers within a gate structure or gate stack of a fin-based transistor (e.g., a fin field effect transistor or "finFET") control, in part, the transistor's threshold voltage. More particularly, the threshold voltage value of a finFET depends on the collective thickness and type of the layers included in its gate stack. Therefore, by controlling the thickness of these layers (or the number of the layers) in each finFET, finFETs can be manufactured with different threshold voltages. For example, finFETs with a low threshold voltage (e.g., between about 80 mV and about 160 mV) can be used for the "low" or "ultra-low" power applications within the chip, and finFETs with high threshold voltage (e.g., greater than about 200 mV) can be used for high power applications within the same chip.

Due to the continuous device scaling and the push for low power portable devices (e.g., mobile phones, smart watches, tablets, etc.), there is a high demand for integrated circuits (ICs) with transistors having lower threshold voltages. P-type finFETs and n-type finFETs can have a different "absolute" threshold voltage value (e.g., the magnitude of the threshold voltage without regard to its sign) because they include different types and/or number of metal layers in their gate stacks. For example, p-type finFETs can have a higher threshold voltage than n-type finFETs and thus require a higher voltage to turn-on (e.g., to allow current to flow between the source and the drain terminals of the transistor). For this reason, n-type finFETs may be referred to as "strong" compared to p-type finFETs, and p-type finFETs may be referred to as "weak" compared to n-type finFETs.

In n-type finFETs, a way to reduce (e.g., lower) the threshold voltage is to increase the thickness and/or the aluminum concentration in a titanium-aluminum layer (TiAl) formed in their gate stack. However, the thickness of the TiAl layer can be limited by scaling constraints. For example, as the fin-to-fin pitch and the channel length decrease, the available space for the TiAl layer shrinks. Thus, increasing the thickness of the TiAl layer in n-type finFETs can become challenging. For example, due to small channel lengths (e.g., less than about 10 nm), existing or thicker TiAl layers can exhibit poor gap-fill, which can lead to voids and an unpredictable threshold voltage variation across transistors in an IC. Further, increasing the Al concentration in the TiAl layer can be challenging because a high Al concentration can impair the transistor's reliability. For example, Al can bond with oxygen and form aluminum-oxygen (Al—O) bonds, which can degrade the time dependent dielectric breakdown (TDDB) and the positive bias temperature instability (PBTI) performance of the transistor. Therefore, increasing the concentration of Al in the TiAl layer of the gate stack increases the amount of Al available for oxygen bonding.

Embodiments of the present disclosure are directed to a method for the formation of gate stacks with TiAl layers having different Al concentration (Al/Ti ratio). In some embodiments, the TiAl layers form a bilayer that includes a bottom TiAl layer having a low Al/Ti ratio and a top TiAl layer having a high Al/Ti ratio. In some embodiments, the TiAl layers form a trilayer that includes a TiAl layer with a high Al/Ti ratio formed between two TiAl layers with a low Al/Ti ratio. In some embodiments, the TiAl layers with the low Al/Ti ratio are titanium-rich (Ti-rich) layers with a fixed or varying Al concentration throughout their thickness. Further, the TiAl layers with the low Al/Ti ratio function as an oxygen getter that traps the oxygen atoms. According to some embodiments, n-type finFETs with a gate stack having a TiAl bilayer exhibits a threshold voltage reduction by about 57% and a saturation current ($I_{sat}$) increase by about 16%.

Figure 1A:
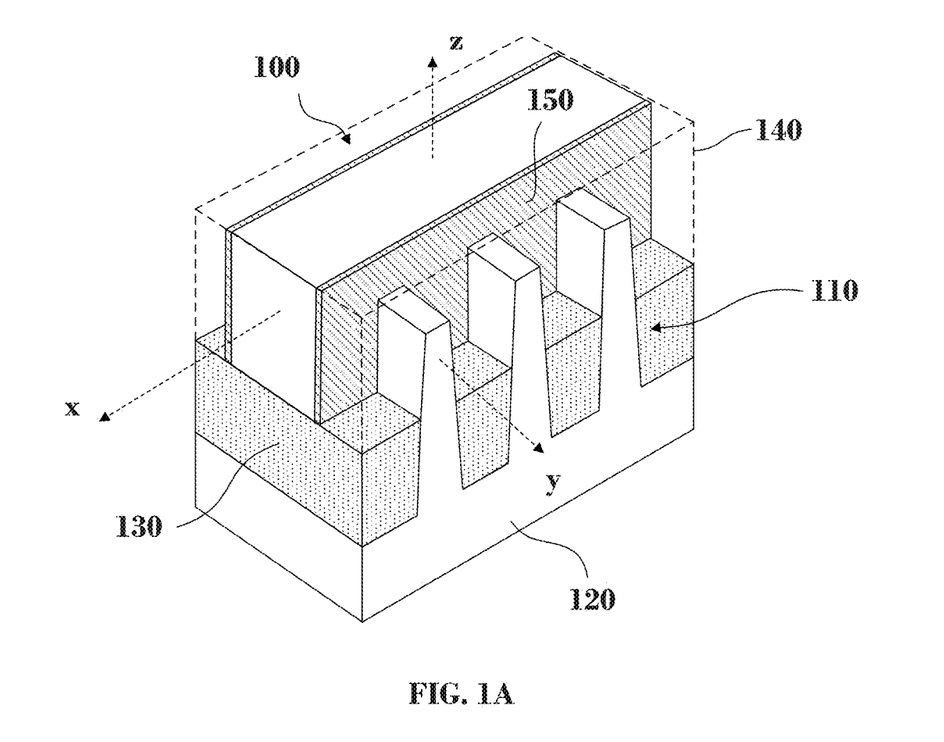
FIG. 1A is an isometric view of a gate stack disposed on fins disposed on a substrate, in accordance with some embodiments.

According to some embodiments, FIG. 1A is an isometric view of a gate stack 100 of an n-type finFET disposed on fins 110. FIG. 1A shows selected portions of the finFETs' structure and other portions are omitted for simplicity. For example, gate stack 100 includes elements not shown in FIG. 1A, such as the source/drain epitaxial regions. The stack of layers in gate stack 100 will be discussed in reference to FIG. 1B.

As shown in FIG. 1A, fins 110 are dispose on substrate 120 and in some embodiments, fins 110 are formed perpendicular to a top surface of substrate 120. Fins 110, according to FIG. 1A, are electrically isolated from each other via isolation regions 130, which further isolate gate stack 100 from substrate 120. Further, a dielectric layer 140, which is disposed on isolation regions 130, surrounds gate stack 100, as shown in FIG. 1A. In some embodiments, spacers 150 are disposed between gate stack 100 and dielectric layer 140. By way of example and not limitation, substrate 120 can be a bulk semiconductor wafer (e.g., silicon wafer) or a top layer of a semiconductor-on-insulator wafer (e.g., a silicon layer of a silicon-on-insulator). In some embodiments, fins 110 can include (i) silicon, (ii) a compound semiconductor such as gallium arsenide (GaAs), gallium nitride (GaN), gallium phosphide (GaP), indium phosphide (InP), indium arsenide (InAs), and/or indium antimonide (InSb), silicon germanium (SiGe), (iii) an alloy semiconductor including, gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP), or (iv) combinations thereof. By way of example and not limitation, isolation regions 130 can be shallow trench isolation (STI) structures that include a silicon-based dielectric material, such as silicon oxide ($SiO_2$), silicon nitride ($Si_3N_4$), silicon oxynitride (SiON), fluorine-doped silicate glass (FSG), a low-k dielectric material (e.g., with a k-value less than about 3.9), and/or other suitable dielectric materials with appropriate gap fill properties.

Figure 1B:
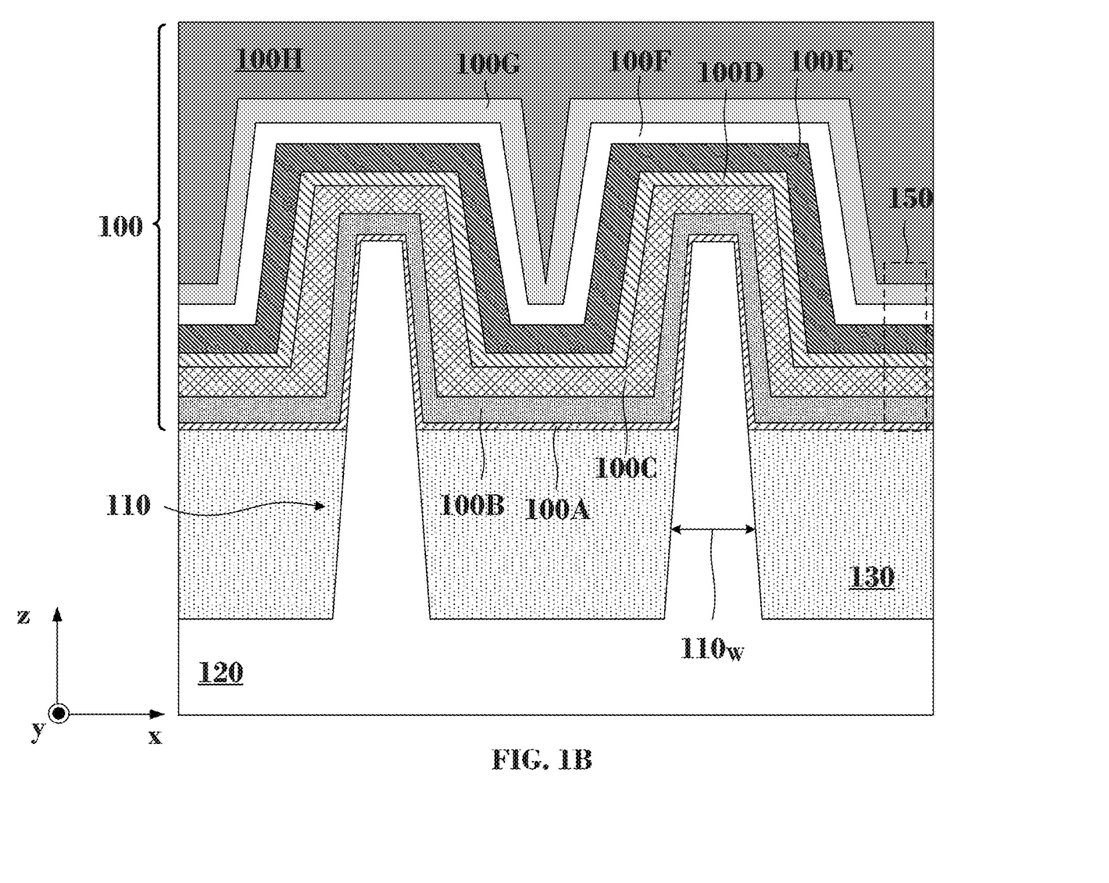
FIG. 1B is a cross-sectional view of a gate stack, in accordance with some embodiments.

According to some embodiments, FIG. 1B is a detailed cross-sectional view of gate stack 100 of the n-type finFET shown in FIG. 1A along the x-axis. In FIG. 1B, width $110_w$ of the fins is shown along the x-axis, while the length of the fins (not shown in FIG. 1B) is along the y-axis and perpendicular to the z-x plane, as shown in FIG. 1A. Further, in FIG. 1B, gate stack 100 is shown with its longest dimension (e.g., along its length) along the x-axis and parallel to width $110_w$ of fins 110. As shown in FIG. 1B, gate stack 100 for an n-type finFET includes several vertically stacked layers. By way of example and not limitation, gate stack 100 can include at least an interlayer dielectric 100A, a high-k dielectric layer 100B, a capping layer 100C, a barrier layer 100D, an optional stack of metallic layers 100E, a TiAl bilayer 100F, a barrier layer 100G, and a metal fill 100H. Gate stack 100 may not be limited to the aforementioned layers and may include additional or fewer layers.

In some embodiments, interlayer dielectric 100A includes a silicon oxide-based dielectric, and high-k dielectric layer 100B includes a high-k material with a dielectric constant (k-value) greater than about 3.9 (e.g., about 4.0, about 4.2, about 4.6, etc.). By way of example and not limitation, interlayer dielectric 100A can include silicon oxide and/or silicon oxynitride, and high-k dielectric layer 100B can include hafnium oxide, lanthanum oxide, aluminum oxide, yttrium oxide, or combinations thereof. In some embodiments, interlayer dielectric 100A and high-k dielectric layer 100B form a gate dielectric stack within gate stack 100. Capping layer 100C is deposited to absorb oxygen from the gate dielectric stack and protect high-k dielectric layer 100B during the formation of barrier layer 100D, optional stack of metallic layers 100E, and metal fill 100H. By way of example and not limitation, capping layer 100C can be a titanium nitride (TiN) layer or a composite material such as titanium silicon nitride (TiSiN). Further, barrier layer 100D can be, for example, a tantalum nitride (TaN) layer.

In some embodiments, optional stack of metallic layers 100E includes one or more individual metallic layers not shown in FIG. 1B for simplicity. The collective thickness of the metallic layers in optional stack of metallic layers 100E can in part modulate the threshold voltage of the transistor. In some embodiments, each of the metallic layers includes titanium nitride and/or tungsten nitride and has a thickness that ranges from about 8 Å to about 20 Å. In some embodiments, gate stack 100 does not include stack of metallic layer 100E between barrier layer 100D and TiAl bilayer 100F. In some embodiments, stack of metallic layer 100E is limited to one or two metallic layers between barrier layer 100D and TiAl bilayer 100F.

By way of example and not limitation, barrier layer 100G can include a TiN layer, which functions as an adhesion layer (e.g., liner) for metal fill 100H. In some embodiments, barrier layer 100G prevents diffusion of halides from metal fill 100H into the underlying layers of gate stack 100. For example, metal fill 100H can include tungsten metal that contains measurable amounts of fluorine or chlorine (e.g., about 2%, about 3%, about 5%, etc.).

Figure 2:
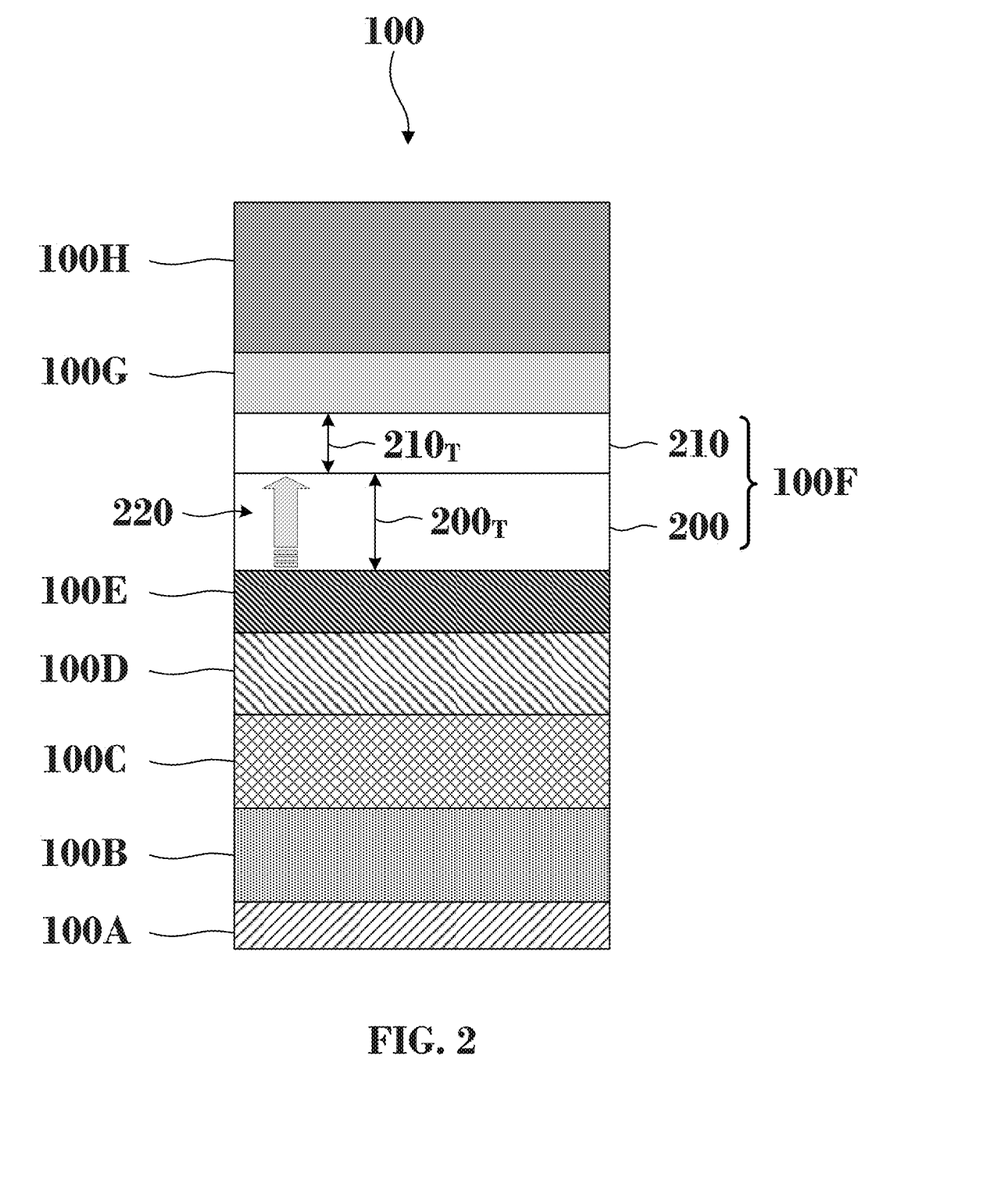
FIG. 2 is a magnified view of a gate stack with a titanium-aluminum bilayer, in accordance with some embodiments.

FIG. 2 is a magnified view of area 150 of gate stack 100 shown in FIG. 1B, where the individual TiAl layers 200 and 210 of TiAl bilayer 100F are shown. In some embodiments, TiAl layer 200 has a lower Al/Ti ratio compared to TiAl layer 210. This means that TiAl layer 200 is substantially Ti-rich compared to TiAl layer 210. According to some embodiments, the Al/Ti ratio in TiAl layer 200 is between 0 and about 80% of that in TiAl layer 210 (e.g., equal to or less than about 80%, between 0 and about 10%, between about 5% and about 30%, between about 15% and about 50%, between about 30% and about 60%, between about 40% and about 80%, etc). In other words, TiAl layer 200 can have up to 0.8 times the Al/Ti ratio of TiAl layer 210 (e.g., 0, about 0.1, about 0.4, about 0.6, about 0.8, etc.

By way of example and not limitation, incorporation of oxygen in the gate stack layers can occur during vacuum breaks between processing operations. Subsequently, oxygen atoms can become mobile and migrate towards the TiAl layer to bond with the Al and Ti atoms. When Al and oxygen atoms bond, the Al atoms in the TiAl layer "lose" their "metal character"—e.g., the Al—Al bond or Al—Ti bond break and are replaced with Al—O bonds to form aluminum oxide, which is a dielectric. This behavior increases the threshold voltage of the n-type transistors and is therefore undesirable. Oxygen atoms that bond to Ti atoms in the TiAl layer have no negative impact on the threshold voltage of the n-type transistors.

In some embodiments, TiAl layer 200 functions as an oxygen getter layer that traps diffused oxygen atoms from underlying layers (e.g., from barrier layer 100D and/or optional stack of metallic layers 100E). According to some embodiments, TiAl layer 200 functions to trap oxygen atoms due to its low Al/Ti ratio (e.g., equal to or less than about 80% of the Al/Ti ratio of TiAl layer 210). This is because TiAl layer 200 is substantially "Ti-rich" and therefore has availability of Ti atoms for oxygen bonding. As the Al concentration increases in the TiAl layer, fewer Ti sites become available for oxygen bonding and oxygen atoms begin to bond with available Al sites—which increases the threshold voltage of the n-type transistors as discussed above. Consequently, increasing the Al/Ti ratio in TiAl layer 200 above 80% of the Al/Ti ratio in TiAl layer 210 can impede the oxygen trapping property of TiAl layer 200. In some embodiments, trapped oxide in TiAl layer 200 does not impact the threshold voltage of the n-type transistor. By way of example and not limitation, TiAl bilayer 100F can reduce the threshold voltage of an n-type transistor by over about 50% (e.g., about 57%) and increase the saturation current ($I_{sat}$) by over about 15% (e.g., about 16%). According to some embodiments, TiAl bilayer 100F does not adversely impact the performance of the p-type transistors. For example, TiAl bilayer 100F does not impact the threshold voltage or other performance metrics of p-type transistors.

In some embodiments, TiAl layer 200 has a thickness $200_T$ that ranges between about 30% and about 300% (e.g., between about 30% and about 70%, between about 50% and about 100%, between about 70% and about 150% between about 130% and about 200%, between about 180% and about 220%, and between about 200% and about 300%) of thickness $210_T$ of TiAl layer 210. For example:

$$210_T \cdot 30\% \leq 200_T \leq 210_T \cdot 300\%$$

Therefore, if thickness $210_T$ of TiAl layer 210 is about 1.5 nm, thickness $200_T$ of TiAl layer 200 can range between about 0.45 nm and about 4.5 nm (e.g., between about 0.45 and about 1 nm, between about 0.5 nm and about 2 nm, between about 1.5 nm and about 3 nm, between about 2 nm and about 3.5 nm, between about 2.5 and about 4.5 nm, etc.).

In some embodiments, TiAl layer 200 can have a varying Al/Ti ratio. For example, the Al/Ti ratio in TiAl layer 200 can gradually increase from the interface with optional stack 100E towards the interface with TiAl layer 210, as indicated by arrow 220. In other words, TiAl layer 200 can have an Al/Ti ratio gradient, where the Al/Ti ratio increases closer to the interface with TiAl layer 210. By way of example and not limitation, the thickness of TiAl layer 200 can range from about 1 nm to about 10 nm (e.g., from about 1 nm to about 5 nm, from about 3 nm to about 7 nm, from about 6 nm to about 9 nm, from about 5 nm to about 10 nm, etc.). Further, the Al/Ti ratio of TiAl layer 200 can gradually increase from 0 (e.g., away from the interface with TiAl layer 210) to about 80% of the Al/Ti ratio in TiAl layer 210 at the interface TiAl layer 210. In some embodiments, the Al/Ti ratio away from the interface with TiAl layer 210 may not be at 0 and may not increase to 80% of the Ti/Al ratio in TiAl layer 210. For example, the Al/Ti ratio of TiAl layer 200 may gradually increase from a non-zero value (e.g., from about 1 from about 5%, from about 10%, etc.) up to 80% of the Ti/Al ratio in TiAl layer 210 (e.g., up to about 50% up to about 60%, up to about 70%, up to about 80%, etc.).

Figure 3:
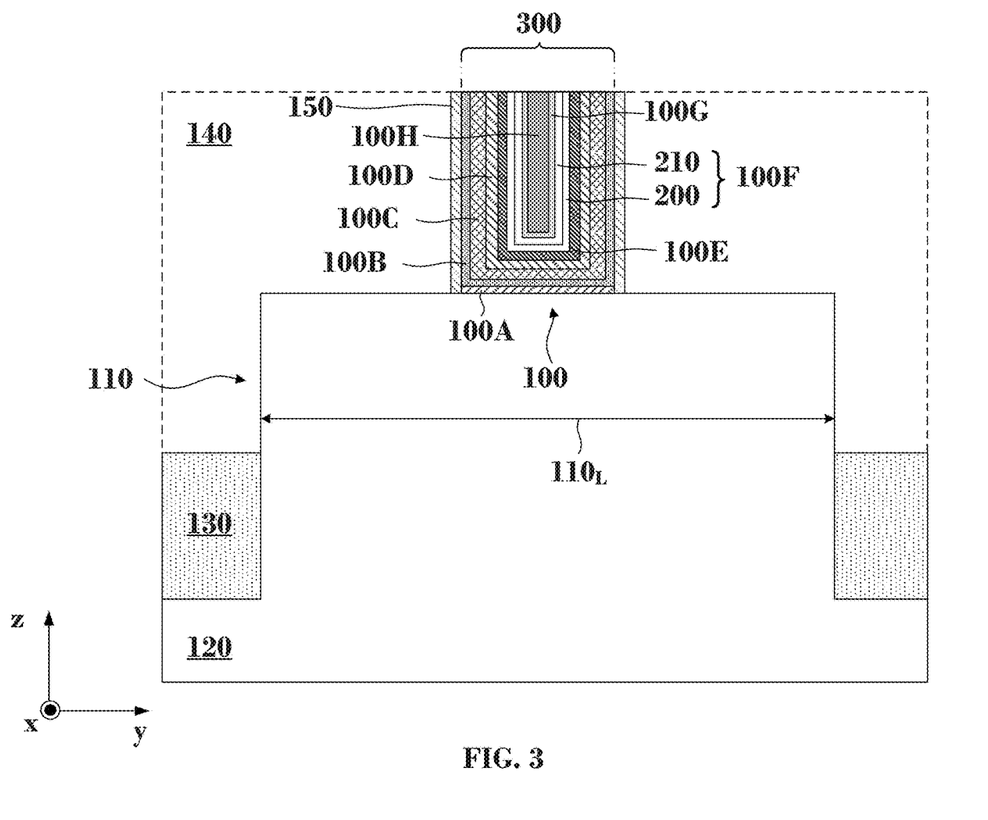
FIG. 3 is a cross-sectional view of a gate stack, in accordance with some embodiments.

According to some embodiments, FIG. 3 is a cross-sectional view of gate stack 100 on fin 110 along the y-axis shown in FIG. 1A. Consequently, in FIG. 3, length $110_L$ of fin 110 is along the y-axis and parallel to the y-z plane, as shown in FIG. 1A. Therefore, in FIG. 3, gate stack 100 is shown with its shortest dimension 300 (e.g., along the y-axis in FIG. 1A) parallel to length $110_L$ of fin 110. In some embodiments, spacers 150 are formed between the vertical sidewalls of gate stack 100 and dielectric layer 140.

Figure 4:
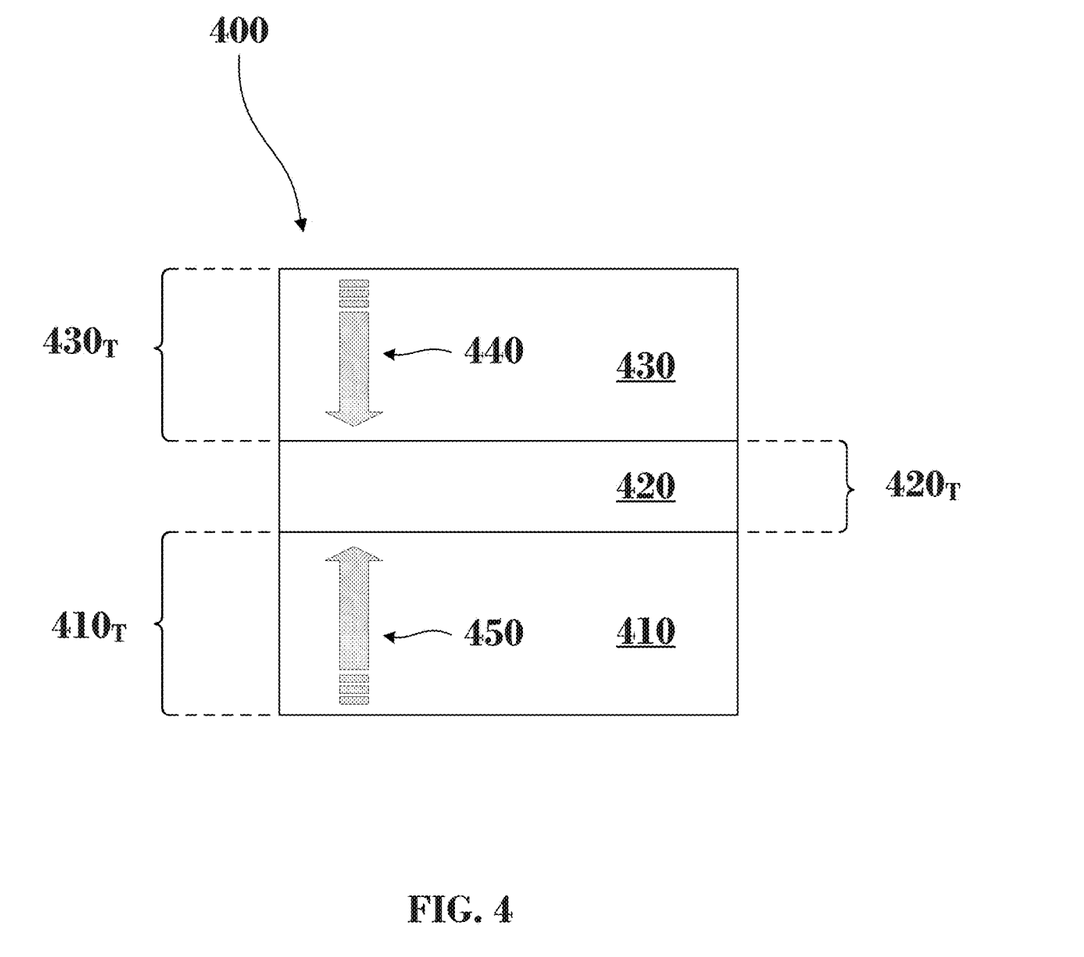
FIG. 4 is a cross-sectional view of a titanium-aluminum trilayer, in accordance with some embodiments.

In some embodiments, the TiAl stack is a trilayer structure that includes a TiAl layer that is interposed between two TiAl layers that have a lower Al/Ti ratio compared to the intervening middle TiAl layer (e.g., less than 80% of the Al/Ti ratio of the intervening middle TiAl layer). By way of example and not limitation, FIG. 4 is a cross-sectional view of TiAl trilayer 400 that includes a bottom layer 410 and top layer 430 with the low Al/Ti ratio and a middle TiAl layer 420 with the high Al/Ti ratio. In FIG. 4, other layers of the gate stack are not shown for simplicity. According to some embodiments, the thickness of the top and bottom TiAl layers (e.g., $410_T$ and $430_T$, respectively) can range between about 30% and about 300% (e.g., between about 30% and about 70%, between about 50% and about 100%, between about 70% and about 150%, between about 130% and about 200%, between about 180% and about 220%, and between about 200% and about 300%) of the thickness $420_T$ of middle TiAl layer 420. For example:

$$420_T \cdot 19\ 30\% \leq 410_T, 430_T \leq 420_T \cdot 300\%$$

In some embodiments, any thickness combination for TiAl layers 410, 420, and 430 in TiAl trilayer 400 is possible within the aforementioned range. For example, TiAl layers 410, 420, and 430 can have substantially the same thickness or a different thickness. Further, any two of the TiAl layers can have substantially the same thickness, but a different thickness from the third layer, etc.

in some embodiments, the Al/Ti ratio in TiAl layers 410 and 430 is between 0 and 80% (e.g., less than about 80%, between 0 and about 10%, between about 5% and about 30%, between about 15% and about 50%, between about 30% and about 60%, and between about 40% and about 80%, etc.) of the Al/Ti ratio in TiAl layer 420. Further, the Al/Ti ratio in TiAl layers 410 and 430 can be substantially the same or different. According to some embodiments, a trilayer TiAl stack, such as TiAl trilayer 400, protects middle TiAl layer 420 from oxygen diffusion from layers deposited after TiAl trilayer 400, as well as from oxygen diffusion from layers formed before TiAl trilayer 400.

In some embodiments, the Al/Ti ratio of TiAl layers 410 and 430 can vary, like in TiAl layer 200 of TiAl bilayer 100F shown in FIG. 2. Further, in the case of TiAl layer 430, the Al/Ti ratio is higher towards the interface with middle TiAl layer 420 and lower away from the interface with TiAl layer 420, as indicated with arrow 440. Respectively, arrow 450 indicates the direction of the Al/Ti ratio gradient in TiAl layer 410. Further, in some embodiments, only one of the two TiAl layers 410 or 430 may have a varying Al/Ti ratio.

Similarly to the case of TiAl layer 200 of TiAl bilayer 100F shown in FIG. 2, TiAl layers 410 and 430 can have a variable Al/Ti ratio that ranges from 0 to about 80% (e.g., less than about 80%) of the Al/Ti ratio in TiAl layer 420.

In some embodiments, the thickness of the TiAl layers in TiAl bilayer 100F and TiAl trilayer 400 can be configured so that TiAl bilayer 100F and TiAl trilayer 400 have substantially the same thickness. By way of example and not limitation the thickness of the TiAl bilayer 100F and TiAl trilayer 400 can be equal to or less than about 30 nm (e.g., about 10 nm, about 15 nm, about 20 nm, about 25 nm, about 30 nm, etc).

Figure 5:
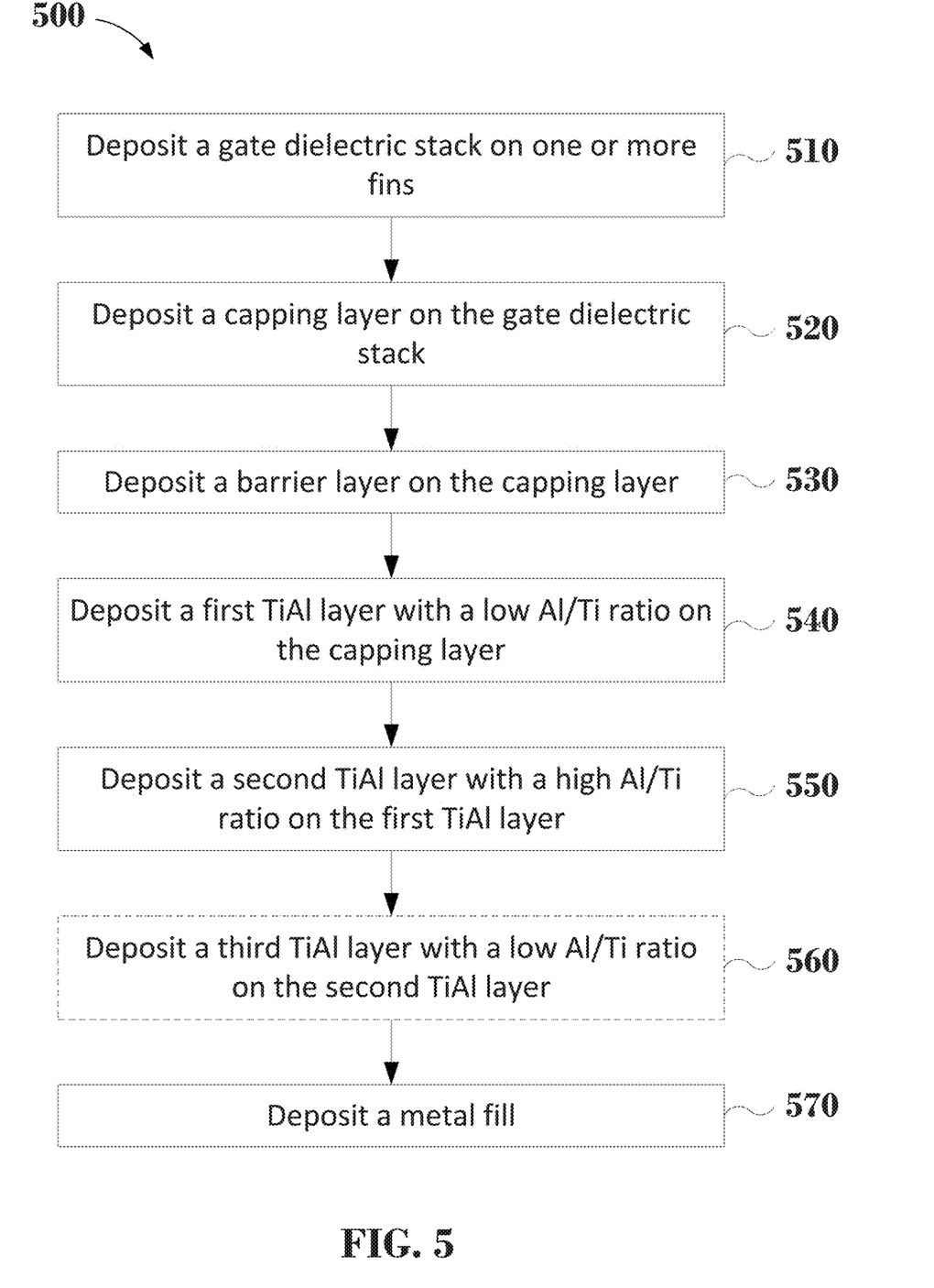
FIG. 5 is a method for the formation of a titanium-aluminum bilayer or a titanium-aluminum trilayer in a gate stack, in accordance with some embodiments.

According to some embodiments, FIG. 5 is a flow chart of a method 500 for the formation of TiAl bilayer and/or trilayer stacks in a gate stack of a finFET (e.g., n-type finFET). Other fabrication operations may be performed between the various operations of method 500 and may be omitted merely for clarity. Embodiments of the present disclosure are not limited to method 500. Method 500 will be described in reference to FIGS. 1-4.

In referring to FIG. 5, method 500 begins with operation 510 and the deposition of a gate dielectric stack on one or more fins. In some embodiments, the gate dielectric stack includes interlayer dielectric 100A and high-k dielectric layer 100B shown in FIGS. 1-3. In some embodiments, and in referring to FIG. 1, interlayer dielectric 100A and high-k dielectric layer 100B are deposited on the exposed portions of fins 110 and the top surface of isolation regions 130. By way of example and not limitation, interlayer dielectric 100A and high-k dielectric layer 100B can be blanket deposited using atomic layer deposition (ALD) or plasma-enhance atomic layer deposition (PEALD) methods. As discussed above, interlayer dielectric 100A can include silicon oxide and/or silicon oxynitride, and high-k dielectric layer 100B can include hafnium oxide, lanthanum oxide, aluminum oxide, other high-k dielectric materials (e.g., with k value greater than 3.9), or combinations thereof.

In referring to FIG. 5, method 500 continues with operation 520, where a capping layer is deposited on the gate dielectric stack. Referring to FIGS. 1 and 3, capping layer 100C can be blanket deposited on high-k dielectric layer 100B. As discussed above, capping layer 100C can include, for example, TiN or a composite material, such as TiSiN.

Method 500 continues with operation 530 and the deposition of barrier layer on the capping layer. In referring to FIGS. 1-3, barrier layer 100D can be blanket deposited on capping layer 100C. By way of example and not limitation, capping layer 100C can be a TaN film deposited by any suitable method, including but not limited to physical vapor deposition (PVD), AT D, PEALD, chemical vapor deposition (CVD), etc. In some embodiments, an optional stack of metallic layers 100E is deposited on barrier layer 100D as shown in FIGS. 1-3. In some embodiments, the optional stack of metallic layers 100E includes one or more individual metallic layers (not shown in FIGS. 1-3), where each of the metallic layers includes titanium nitride and/or tungsten nitride and has a thickness between about 8 Å and about 20 Å (e.g., between about 8 Å to about 15 Å, between about 12 Å to about 18 Å, and between about 16 Å to about 20 Å).

In referring to FIG. 5, method 500 continues with operation 540 and the deposition of a first TiAl layer with a low Al/Ti ratio on the barrier layer, or on the optional stack of metallic layers if present. For example, referring to FIGS. 2 and 4, the first TiAl layer is TiAl layer 200 shown in FIGS. 2 and 3 or the TiAl layer 410 shown in FIG. 4. According to some embodiments, TiAl layer 200 of FIG. 2 or TiAl layer 410 can have a fixed or a varying Al/Ti ratio that can range from about 0 to about 80% (e.g., equal to or less than about 80%, between 0 and about 10%, between about 5% and about 30%, between about 15% and about 50%, between about 30% and about 60%, and between about 40% and about 80%, etc.) of the Al/Ti ratio in TiAl layer 210 or TiAl layer 420, respectively.

By way of example and not limitation, an ALD process can be used to deposit TiAl layers 200 and 410. The ALD process can utilize a dual-precursor source to independently introduce Ti and Al in the deposition reactor. Exemplary precursor sources for Ti and Al can include titanium tetrachloride ($TiCl_4$) and trimethylaluminum ($Al_2(CH_3)_6$) or titanium tetrachloride ($TiCl_4$) and aluminumtriethyl ($(C_2H_5)_3Al$). In some embodiments, the Al/Ti ratio in TiAl layers 200 and 410 can be tuned by changing the process conditions during deposition. For example, the Al/Ti ratio can be tuned by modulating the residence time for the Al precursor during each deposition cycle (e.g., the deposition cycle time), the Al precursor to carrier gas (e.g., argon or nitrogen) flow ratio for each deposition cycle, the Al precursor flow rate, the purge time, the process pressure, the process temperature, or combinations thereof. By way of example and not limitation, to reduce the amount of Al in the Tim layer, the Al precursor flow can be reduced for each deposition cycle, while the purge time can increase. If a varying Al/Ti ratio is desired, changes to the process conditions can be made at predetermined intervals during the deposition. Further, the thickness $200_T$ and $410_T$ of these layers can be adjusted through the number of deposition cycles. The deposition temperature can be between about 250° C. and about 600° C. (e.g., between about 250° C. and about 300° C., between about 270° C. and about 350° C. between about 300° C. and about 400° C., between about 350° C. and about 475° C., between about 450° C. and about 550° C., and between about 500° C. and about 600° C.). Deposition temperatures below about 250° C. may not be high enough to trigger a reaction between the Al precursor and the Ti precursor, and temperatures greater than about 600° C. may crystallize high-k dielectric layer 100B and compromise its dielectric properties. The aforementioned method of forming the desired Al/Ti ratio in TiAl layers 200 and 410 is not limited to the description provided above and additional processes or process conditions may be used to modify the Al/Ti ratio depending on the deposition method used. These additional process conditions and deposition methods are within the spirit and the scope of this disclosure.

Referring to FIG. 5, method 500 continues with operation 550 and the deposition of a second TiAl layer with a high Al/Ti ratio on the first TiAl layer. For example, the AlTi ratio in the second TiAl layer is greater than the Al/Ti ratio in the first TiAl layer. In other words, the first TiAl layer is Ti-rich compared to the second TiAl layer. The second TiAl layer can be, for example, TiAl layer 210 shown in FIGS. 2 and 3 or TiAl layer 420 shown in FIG. 4. In some embodiments, the deposition of the second TiAl layer occurs without a vacuum break. This means that the first and second TiAl layers are deposited in-situ (e.g., in the same deposition reactor) to avoid additional oxygen incorporation into the layers. According to some embodiments, the thickness of the first TiAl layer deposited in operation 540 is between about 0.3 and about 3 times the thickness of the second TiAl layer deposited in operation 550 (e.g., between about 30% and about 300% of the thickness of the second TiAl layer). By way of example and not limitation, if the thickness of the second TiAl layer is about 2 nm, the thickness of the first TiAl layer can range between about 0.6 nm and about 6 nm.

in some embodiments, the first TiAl layer acts as an oxygen getter layer that traps oxygen atoms out-diffusing from previously deposited layers. Further, the second TiAl layer is deposited with a fixed Al/Ti ratio. According to some embodiments, the second TiAl layer deposited in operation 550 modulates the threshold voltage of n-type finFET transistors. In some embodiments, aside from their Al/Ti ratio (composition), the first and second TiAl layers deposited in operations 540 and 550 have substantially the same microstructure.

In some embodiments, method 500 includes an optional operation 560, where a third TiAl layer with a lower Al/Ti ratio than the Al/Ti ratio of the second TiAl layer is deposited on the second TiAl layer. Optional operation 560 can be performed when a TiAl trilayer stack is desired. By way of example and not limitation, the third TiAl layer deposited in operation 560 is similar to TiAl layer 430 of TiAl trilayer 400 shown in FIG. 4. In some embodiments, similarly to the first TiAl layer, the third TiAl layer has an Al/Ti ratio that ranges between 0 and 80% (e.g., equal to or less than about 80%, between 0 and about 10%, between about 5% and about 30%, between about 15% and about 50%, between about 30% and about 60%, between about 40% and about 80%, etc.) of the Al/Ti ratio in the second TiAl layer. Further, the Al/Ti ratio of the third TiAl layer can be fixed or varied, similar to the Al/Ti ratio in the first TiAl laver. In the case where the Al/Ti ratio in third TiAl layer varies, the direction of the Al/Ti ratio gradient is indicated by arrow 440 in FIG. 4, where the Al/Ti ratio increases closer to the interface with TiAl layer 420 (e.g., the second TiAl layer) and decreases away from the interface with TiAl layer 420.

In some embodiments, the third TiAl layer of operation 560 is deposited in-situ with the second and first TiAl layers of operations 550 and 540 respectively. Further, the second TiAl layer in operation 550 is a reference layer for determining the Al/Ti ratio and the thickness of the first and third TiAl layers in operations 540 and 560 of method 500.

In some embodiments, a TiAl bilayer or trilayer can be deposited in preferred transistors by masking transistors not receiving the TiAl bilayer or trilayer with a hard mask (e.g., titanium nitride or aluminum oxide layer). Further, using hard mask patterning, one transistor may receive a TiAl bilayer and another transistor may receive a TiAl trilayer. Additionally, it is also possible that two transistors may receive TiAl bilayers with different Al/Ti ratios in their respective first TiAl layers. Therefore, transistors with different combinations or permutations of TiAl bilayers, trilayers, and Al/Ti ratios for their respective first and third layers may be formed on a substrate and included in the same integrated circuit.

In referring to FIG. 5, method 500 continues with operation 570 and the deposition of the metal fill that completes the formation of the gate stack. In some embodiments, the metal fill deposition includes the deposition of barrier stack 100G and metal fill 10011 shown in FIGS. 1B, 2, and 3.

Figure 6:
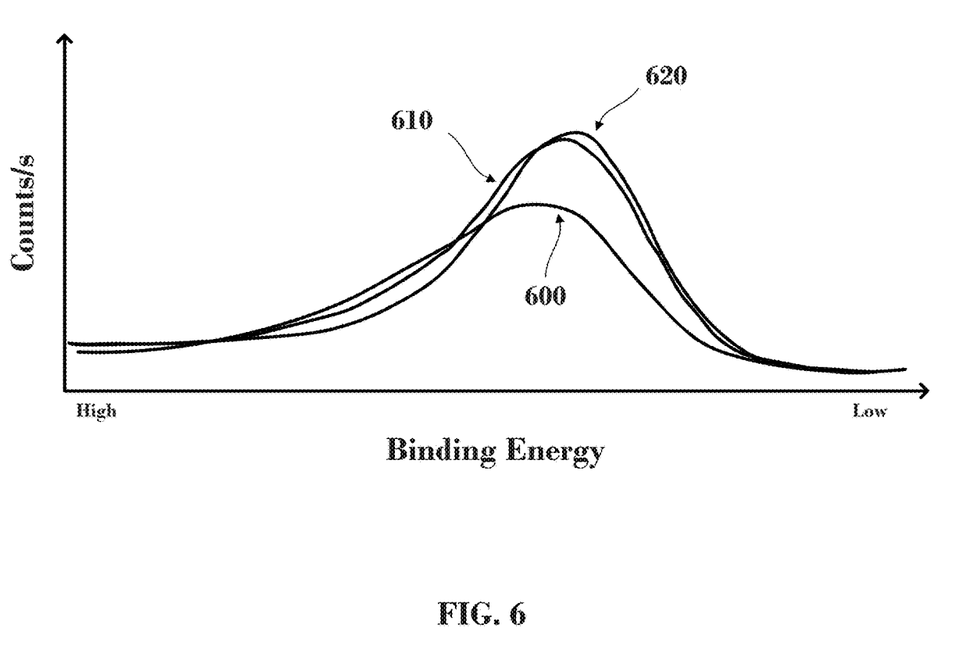
FIG. 6 is an x-ray photoelectron spectroscopy (XPS) spectrum of aluminum 2p orbital (Al2p) peaks from reference titanium-aluminum layers in three different gate stacks, in accordance with some embodiments.

According to some embodiments, FIG. 6 is an x-ray photoelectron spectroscopy (XPS) spectrum of aluminum 2p orbital (Al2p) peaks from reference TiAl layers in three different gate stacks. More specifically, Al2p peak 600 is from a reference TiAl layer without Ti-rich layers in a first gate stack (single TiAl layer); Al2p peak 610 is from a reference TiAl layer disposed on a Ti-rich TiAl layer grown with method 500 in a second gate stack (e.g., a TiAl bilayer with a bottom Ti-rich Ti Al layer); and Al2p peak 620 is from a reference TiAl layer disposed between two Ti-rich Ti/Al layers grown with method 500 in a third gate stack (e.g., a TiAl trilayer with a bottom and a top Ti-rich TiAl layers). In some embodiments, the thickness of the reference TiAl layer in the first gate stack is substantially equal to the thickness of the TiAl bilayer in the second stack and to the thickness of the TiAl trilayer in the third stack. This means that the reference TiAl layer in the first gate stack is thicker than the reference TiAl layer in the TiAl bilayer of the second stack and the TiAl trilayer of the third gate stack.

According to FIG. 6, the Al2p peaks 610 and 620 from the reference TiAl layers in the TiAl bilayer and TiAl trilayer respectively have a larger relative intensity (e.g., greater peak height and lower full width at half max) and are shifted towards a lower binding energy compared to Al2p peak 600 from the reference TiAl. layer that does not have Ti-rich layers. This indicates that the reference TiAl layers in the TiAl bilayer and TiAl trilayer are more "metallic" (e.g., have a greater number of Al—Al bonds) compared to the reference TiAl layer without Ti-rich TiAl layers. According to some embodiments, additional Al—Al bonds correlate to a lower threshold voltage for an n-type transistor.

Based on the above, an n-type transistor with a TiAl bilayer or a TiAl trilayer formed according to method 500 will exhibit a lower threshold voltage compared to an n-type transistor with a TiAl layer without Ti-rich TiAl layers. In some embodiments, this threshold voltage reduction is achieved without an increase in the total TiAl thickness, which can be beneficial for future technology nodes that may require TiAl thickness scaling.

Embodiments of the present disclosure are directed to a method for the formation of gate stacks with TiAl layers having different Al concentrations (e.g., different Al/Ti ratios). In some embodiments, the TiAl layers form a bilayer that includes a first TiAl layer with a lower Al/Ti ratio than a second TiAl layer (e.g., with the first TiAl layer having equal to or less than about 80% of the Al/Ti ratio in the second TiAl layer, between 0 and about 10%, between about 5% and about 30%, between about 15% and about 50%, between about 30% and about 60%, between about 40% and about 80%, etc.). In some embodiments, the TiAl layers form a trilayer that includes a TiAl layer with the high Al/Ti ratio formed between two TiAl layers with the low Al/Ti ratio. In some embodiments, the TiAl layers with the low Al/Ti ratio are titanium-rich (Ti-rich) layers with a fixed or a varying Al concentration throughout their thickness. In some embodiments, the Al/Ti ratio in the Ti-rich TiAl layers is between 0 and about 80% (e.g., equal to or less than about 80%, between 0 and about 10%, between about 5% and about 30%, between about 15% and about 50%, between about 30% and about 60%, between about 40% and about 80%, etc.) of the TiAl ratio in the TiAl layer with the high Al/Ti ratio. In some embodiments, the thickness of the TiAl layers with the low Al/Ti ratio is about 30% to about 300% of the thickness of the TiAl layer with the high Al/Ti ratio. Further, the TiAl layers with the low Al/Ti ratio function as an oxygen getter that traps oxygen atoms in the gate stack. According to some embodiments, n-type finFETs with a gate stack having a TiAl bilayer shows a threshold voltage reduction by over 50% (e.g., about 57%) and a saturation current ($I_{sat}$) increase by over 15% (e.g., about 16%).

In some embodiments, a semiconductor structure includes fins on a substrate, an isolation layer on the substrate that covers a bottom portion of the fins, and a gate structure on a portion of the fins not covered by the isolation layer. Further, the gate structure of the semiconductor structure includes a first TiAl layer on the fins with a first Al/Ti ratio and a second TiAl layer on the first TiAl layer with a second Al/Ti ratio that is greater than the first Al/Ti ratio.

In some embodiments, a semiconductor structure includes fins on a substrate, an isolation region on the substrate covering a bottom portion of the fins, and a gate structure on a portion of the fins not covered by the isolation region. The gate structure of the semiconductor structure includes a first TiAl layer with a first Al/Ti ratio, a second TiAl layer with a second Al/Ti ratio that is greater than the first Al/Ti ratio, and a third TiAl layer with a third Al/Ti ratio that is less than the second Al/Ti ratio. Further, the second TiAl layer is disposed between the first and third TiAl layers.

In some embodiments, a semiconductor structure includes a fin on a substrate, an isolation region on the substrate that covers a bottom portion of the fin, and a gate stack on a portion of the fin and on a portion of the isolation region. The gate stack of the semiconductor structure includes a dielectric stack on the fin, a capping layer on the dielectric stack, a barrier layer on the capping layer; a TiAl stack on the barrier layer with two or more TiAl layers, and a metal fill on the TiAl stack.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   fins on a substrate;
   an isolation layer on the substrate covering a bottom portion of the fins; and
   a gate structure on a portion of the fins not covered by the isolation layer, wherein the gate structure comprises:
      a first titanium-aluminum (TiAl) layer on the fins having a first Al/Ti ratio; and
      a second TiAl layer on the first TiAl layer having a second Al/Ti ratio greater than the first Al/Ti ratio.

2. The semiconductor structure of claim 1, wherein the first Al/Ti ratio is equal to or less than about 80% of the second Al/Ti ratio.

3. The semiconductor structure of claim 1, wherein a thickness of the first TiAl layer is between about 30% and about 300% of a thickness of the second TiAl layer.

4. The semiconductor structure of claim 1, wherein the first Al/Ti ratio varies within the first TiAl layer.

5. The semiconductor structure of claim 1, wherein the gate structure further comprises a third TiAl layer on the second TiAl layer, wherein the third TiAl layer has a third Al/Ti ratio less than the second Al/Ti ratio.

6. The semiconductor structure of claim 5, wherein the third Al/Ti ratio is equal to or less than about 80% of the second Al/Ti ratio.

7. The semiconductor structure of claim 5, wherein a thickness of the third TiAl layer is between about 30% and about 300% of that of the second TiAl layer.

8. The semiconductor structure of claim 5, wherein the third Al/Ti ratio varies within the third TiAl layer.

9. A semiconductor structure, comprising:
   fins on a substrate;
   an isolation region on the substrate covering a bottom portion of the fins; and
   a gate structure on a portion of the fins not covered by the isolation region, wherein the gate structure comprises:
      a first titanium-aluminum (TiAl) layer having a first Al/Ti ratio;
      a second TiAl layer having a second ratio greater than the first Al/Ti ratio; and
      a third TiAl layer having a third Al/Ti ratio less than the second Al/Ti ratio, wherein the second TiAl layer is disposed between the first and third TiAl layers.

10. The semiconductor structure of claim 9, wherein the first and third Al/Ti ratios are less than about 80% of the second Al/Ti ratio.

11. The semiconductor structure of claim 9, wherein each of the first and second TiAl layers has a thickness between about 30% and about 300% of that of the third TiAl layer.

12. The semiconductor structure of claim 9, wherein the first or second Al/Ti ratio varies within the first or second TiAl layer respectively.

13. The semiconductor structure of claim 9, wherein the first and second Al/Ti ratios vary within the first and second TiAl layers respectively.

14. The semiconductor structure of claim 9, wherein the first, second, and third TiAl layers form a TiAl stack.

15. A semiconductor structure, comprising:
   a fin on a substrate;
   an isolation region on the substrate covering a bottom portion of the fin; and
   a gate stack on a portion of the fin and on a portion of the isolation region, wherein the gate stack comprises:
      a dielectric stack on the fin;
      a capping layer on the dielectric stack;
      a barrier layer on the capping layer;
      a titanium-aluminum (TiAl) stack on the barrier layer and comprising two or more TiAl layers; and
      a metal fill on the TiAl stack.

16. The semiconductor structure of claim 15, wherein the two or more TiAl layers comprise:
   a first TiAl layer having a first Al/Ti ratio; and
   a second TiAl layer having a second Al/Ti ratio greater than the first Al/Ti ratio.

17. The semiconductor structure of claim 16, wherein the first Al/Ti ratio is equal to or less than about 80% of the second Al/Ti ratio.

18. The semiconductor structure of claim 16, wherein the first Al/Ti ratio varies within the first TiAl layer.

19. The semiconductor structure of claim 15, wherein the two or more TiAl layers comprise:
   a first TiAl layer having a first Al/Ti ratio;
   a second TiAl layer having a second. Al/Ti ratio; and
   a third TiAl layer having a third Al/Ti ratio, wherein the second Al/Ti ratio is greater than the first and third Al/Ti ratios and the second TiAl layer is disposed between the first and the third TiAl layers.

20. The semiconductor structure of claim 19, wherein the first and third Al/Ti ratios are equal to or less than about 80% of the second Al/Ti ratio.

* * * * *

UNITED STATES PATENT AND TRADEMARK OFFICE
CERTIFICATE OF CORRECTION

PATENT NO. : 10,797,151 B2
APPLICATION NO. : 16/438168
DATED : October 6, 2020
INVENTOR(S) : Wang et al.

Page 1 of 2

It is certified that error appears in the above-identified patent and that said Letters Patent is hereby corrected as shown below:

In the Specification

In Column 1, Line 16, please replace "cart" with -- can --, therefor.

In Column 2, Lines 8-9, please replace "accordingly," with -- accordingly. --, therefor.

In Column 4, Line 65, please replace "etc)." with -- etc.). --, therefor.

In Column 4, Line 67, please replace "etc." with -- etc.). --, therefor.

In Column 5, Line 43, please replace "150%" with -- 150%, --, therefor.

In Column 6, Line 4, please replace "Ti/Al" with -- TiAl --, therefor.

In Column 6, Line 7, please replace "1" with -- 1%, --, therefor.

In Column 6, Line 8, please replace "Ti/Al" with -- TiAl --, therefor.

In Column 6, Line 9, please replace "50%" with -- 50%, --, therefor.

In Column 6, Line 39, please replace "$420_T19\ 30\% \leq 410_T$," with -- $420_T.30\% \leq 410_T$, --, therefor.

In Column 6, Line 47, please replace "in some" with -- In some --, therefor.

In Column 7, Line 12, please replace "etc)." with -- etc.). --, therefor.

In Column 7, Line 50, please replace "AT D," with -- ALD, --, therefor.

In Column 8, Line 24, please replace "Tim" with -- TiAl --, therefor.

Signed and Sealed this
Twenty-ninth Day of December, 2020

Andrei Iancu
*Director of the United States Patent and Trademark Office*

CERTIFICATE OF CORRECTION (continued)
U.S. Pat. No. 10,797,151 B2

In Column 8, Line 50, please replace "AlTi" with -- Al/Ti --, therefor.

In Column 9, Line 1, please replace "in some" with -- In some --, therefor.

In Column 9, Line 27, please replace "laver." with -- layer. --, therefor.

In Column 9, Line 34, please replace "TiAl" with -- TiAl --, therefor.

In Column 9, Line 56, please replace "10011" with -- 100H --, therefor.

In Column 9, Line 65, please replace "Ti Al" with -- TiAl --, therefor.

In Column 9, Line 66, please replace "Ti/Al" with -- TiAl --, therefor.

In the Claims

In Column 12, Claim 9, Line 14, please replace "ratio" with -- Al/Ti ratio --, therefor.